(12) United States Patent
Wang et al.

(10) Patent No.: US 6,358,376 B1
(45) Date of Patent: Mar. 19, 2002

(54) BIASED SHIELD IN A MAGNETRON SPUTTER REACTOR

(75) Inventors: Wei Wang, Santa Clara; Jianming Fu, San Jose; Praburam Gopalraja, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/613,880

(22) Filed: Jul. 10, 2000

(51) Int. Cl.[7] .............................................. C23C 14/35
(52) U.S. Cl. ........................... 204/192.12; 204/298.06; 204/298.08; 204/298.11; 204/298.14; 204/298.19; 204/298.2
(58) Field of Search ..................... 204/298.06, 298.08, 204/298.11, 298.14, 298.19, 298.2, 192.12

(56) References Cited

U.S. PATENT DOCUMENTS

| | | | |
|---|---|---|---|
| 4,038,171 A | * 7/1977 | Moss et al. ............ | 204/298.06 |
| 5,178,739 A | 1/1993 | Barnes et al. ........... | 204/192.12 |
| 5,202,008 A | 4/1993 | Talieh et al. ............ | 204/192.32 |
| 5,316,645 A | 5/1994 | Yamagami et al. .... | 204/298.06 |
| 5,736,021 A | 4/1998 | Ding et al. ............. | 204/298.11 |
| 5,824,197 A | 10/1998 | Tanaka ................... | 204/192.12 |
| 5,879,523 A | 3/1999 | Wang et al. ............ | 204/298.11 |
| 5,897,752 A | 4/1999 | Hong et al. ............. | 204/192.12 |

FOREIGN PATENT DOCUMENTS

| | | | | |
|---|---|---|---|---|
| JP | 63-282263 | * | 11/1988 | .............. 204/298.2 |
| JP | 9-186088 | * | 7/1997 | |

* cited by examiner

*Primary Examiner*—Rodney G. McDonald
(74) *Attorney, Agent, or Firm*—Charles S. Guenzer

(57) ABSTRACT

A magnetron sputter reactor and its method of operation which produces a high fraction of sputtered metal ions and in which the metal ions are confined by a positively biased shield and attracted to a negatively biased pedestal electrode supporting the wafer to be sputter coated. The shield may be positively biased to between 10 and 50VDC, preferably between 15 and 40VDC while the negative self-bias on the pedestal is typical tens of volts. A grounded shield is positioned between the target and the biased shield.

15 Claims, 2 Drawing Sheets

BIASED SHIELD IN A MAGNETRON SPUTTER REACTOR

FIELD OF THE INVENTION

The invention relates generally to plasma sputtering and reactors used therefor. In particular, the invention relates to the chamber shields used in plasma sputter reactors and their electrical biasing.

BACKGROUND ART

Sputtering, alternatively called physical vapor deposition (PVD), is the most prevalent method of depositing layers of metals and related materials in the fabrication of semiconductor integrated circuits. In the most commercially important type of sputtering, DC magnetron sputtering, a metallic target composed of the material to be sputter deposited is biased negatively with respect to the chamber. Argon working gas is admitted to the chamber at a pressure in the low milliTorr range, and the electrical biasing of the target causes the argon to be excited into a plasma. The positive argon ions are attracted to the negatively biased target with sufficient energy that the argon ions sputter metal atoms from the target. Some of the sputtered atoms strike the wafer and are deposited thereon in a thin layer. In reactive sputtering, a reactive gas, for example, nitrogen or oxygen, is additionally admitted into the sputter chamber, and the sputtered metal atoms react with the nitrogen or oxygen atoms or excited radicals to form a metal nitride or oxide layer on the wafer.

One of the more demanding applications of sputtering is to deposit a metal or a metal nitride onto the sides and bottom of inter-level via holes having very high aspect ratios. That is, the holes are narrow and deep. Aspect ratios of five or more are becoming common in advanced circuit designs. Sputtering is generally a ballistic process producing a nearly isotropic emission pattern for the atoms sputtered from the target toward the wafer being sputter coated. This emission pattern is poorly suited for coating the sides of a deep, narrow hole. Assuming the continuation of the original emission pattern, relatively few sputtered atoms reach the bottom of the hole. Furthermore, for thick layers, it is likely that a sufficient number of sputtered atoms coat the upper corners of the hole to bridge the top of the hole before the bottom of the hole is filled, thereby creating a void.

Nonetheless, several approaches are available for sputtering with high aspect ratios. Several commercially important approaches increase the number of the sputtered atoms that are ionized and also cause the wafer to be negatively biased with respect to the plasma and the chamber walls. The biasing can be accomplished either by applying a negative DC bias to the pedestal electrode supporting the wafer in the target, by applying an RF bias to the pedestal electrode which, due to the dynamics of a plasma, creates a negative DC bias on the pedestal electrode, or even leaving the pedestal electrode to be electrically floating, in which case a negative DC bias still develops. The biased pedestal electrode sets up a plasma sheath adjacent to the wafer and accelerates the sputtered ions across the sheath toward the wafer with sufficient velocity that the overall pattern of the sputtered ions becomes anisotropic with a strong component normal to the wafer surface. These ions thus are oriented to reach deeply into a high aspect-ratio hole.

One method of increasing the ionization fraction involves sputtering with a high-density plasma (HDP) achieved by coupling a large amount of RF energy into the processing space through an inductive coil wrapped around the processing space. As the sputtered atoms cross the HDP processing space, they are likely to be ionized. HDP sputtering can achieve ionization fractions of above 80% and thus is very effective at deep hole coating. However, HDP sputter reactors are relatively expensive. Also, HDP sputtering is a hot process and relies on energetic ions, including argon ions produced in a working gas pressure in the range of 50 to 100 milliTorr. It is often preferred to sputter coat wafers held at relatively low temperatures, and such temperature control is difficult in an HDP sputter reactor. The quality of HDP sputtered films is not always the best.

An alternative approach, referred to as self-ionized plasma (SIP) sputtering relies upon a variety of techniques to adapt conventional DC magnetron sputter reactors to produce a relatively high plasma density near a restricted portion of the target and to extend the magnetic field lines toward the target. The ionization densities are more modest, typically around 20% though definitely above 5%, but sufficient to cause a reasonable flux deep into holes in a cool, low-pressure process using simple apparatus. SIP sputtering has been described by Fu et al. in U.S. patent application Ser. No. 09/546,798, filed Apr. 11, 2000, now U.S. Pat. No. 6,306,265 by Gopalraja et al. in U.S. patent application Ser. No. 09/518,180, filed Mar. 2, 2000, now U.S. Pat. No. 6,277,249 allowed and by Chiang et al. in U.S. patent application Ser. No. 09/414,614, filed Oct. 8, 1999. All these patent applications are incorporated herein by reference in their entireties.

Most sputter reactors, including the SIP chamber described by Chiang et al., use a grounded shield that extends over most of the chamber sidewall enclosing the processing space between the target and the pedestal. The shield extends further axially downwardly along the chamber sidewall to in back of the wafer, extends radially inwardly toward the pedestal, and then axially upwardly alongside the sides of the pedestal. The result is an annular trough having a higher outer wall and a shorter inner wall. The shield performs two functions. Sputtering inevitably coats other portions exposed inside the chamber and facing the target. When the shield becomes excessively coated, it is quickly replaced with a clean shield without the need to clean the chamber walls. Secondly, the electrically grounded shield acts as the anode in opposition to the negatively biased target cathode to support the sputtering plasma. The pedestal electrode can be held at some other potential to control the sputter deposition pattern.

Effective SIP sputtering requires relative low loss of the plasma electrons and ions to the shield. An unbalanced magnetron is one method promoted by Fu et al. in the above cited patent of reducing such loss. An unbalanced magnetron includes two magnetic poles of unequal total magnetic flux placed on the back surface of the target with the strong pole positioned near the target periphery. The asymmetric pole pattern creates not only a magnetic field component extending parallel (horizontally) and close to the front face of the target but also a vertical component extending from the target periphery away from the shield and toward the wafer before returning to the back of the stronger pole. The vertical component is sufficient to trap electrons along the field lines and thus push the plasma closer to the wafer and away from the grounded shield. Thereby, electron loss is reduced and sputtered ions are guided towards the wafer.

Chiang et al. in the above cited patent additionally include an electrically floating shield positioned between the grounded shield and the target. The floating shield collects some electrons and thus builds up a negative charge to thereafter repel further sinking of electrons. The effect is to push the plasma toward the center of the reactor.

Unbalanced magnetrons, however, suffer some drawbacks. The vertical magnetic field they produce usually extends only part ways toward the wafer before it returns to the stronger pole. Thus, its effect of guiding the plasma toward the wafer typically disappears before the wafer is reached. This shortened influence is worsened by the preference for a long-throw reactor to filter out at least part of the remaining 80% neutral flux and to improve the center-to-edge uniformity. One typical long-throw reactor has a 290 mm spacing between the target and wafer for a 200 mm wafer. Extending the magnetic field over such a distance by means of an unbalanced magnetron is difficult. Further, the asymmetric magnetic field of an unbalanced magnetron inherently degrades the uniformity of sputter coverage.

It is thus desired to provide alternatives to relying on small unbalanced magnetrons for sputter coating of deep holes. Preferably, the upper shield is grounded and the lower shield is held at a voltage higher than the plasma potential.

The biased shield is advantageously used with a sputtering apparatus and method producing a relatively high fraction of ionized sputtered atoms.

DETAILED DESCRIPTION OF THE PREFERRED EMBODIMENTS

Figure 1:
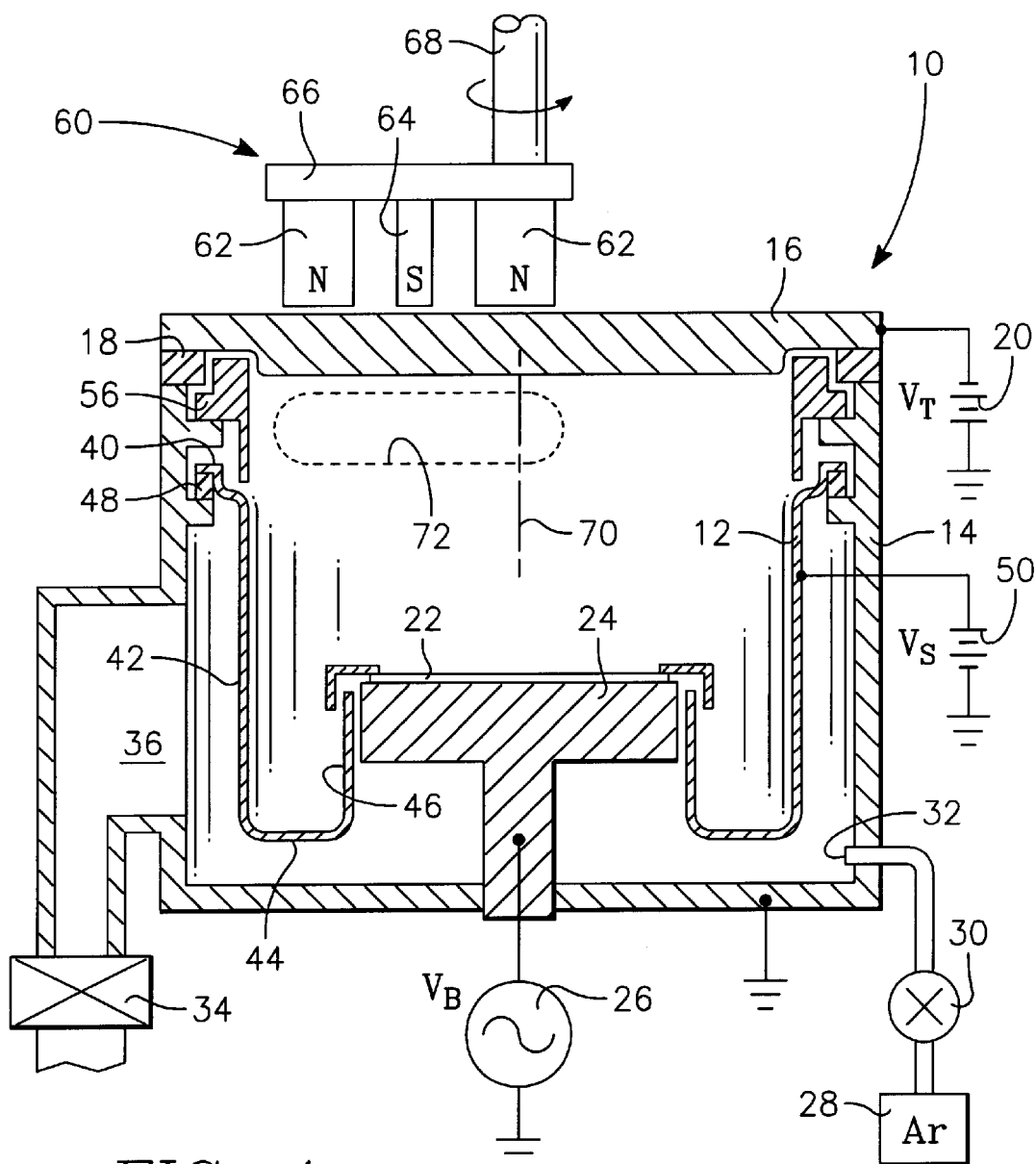
FIG. 1 is a schematic cross-sectional view of a sputter reactor incorporating the biased shield of the invention.

An embodiment of the invention schematically illustrated in the cross-sectional view of FIG. 1 is a magnetron sputter reactor 10 including a biasable shield 12. The principal parts of the reactor 10 are those found in well known diode sputter reactors and in particular a SIP reactor such as that disclosed by Chiang et al. in the above cited patent application. The reactor 10 includes a metal chamber 14 that is electrically grounded. A target 16 having at least a face composed of the material to be sputtered is vacuum sealed to the chamber by a first electrical isolator 18. A DC power supply 20 applies a negative DC voltage $V_T$ to excite and sustain the plasma as described later. Usually the excitation voltage is substantially higher than the voltage needed to maintain the plasma. A wafer 22 to be sputter coated is supported on a pedestal electrode 24 in opposition to the target 16. A clamp or shadow ring 24 may be positioned above and around the periphery of the wafer 22. An electrical bias source 26 is connected to the pedestal electrode 24. Preferably, the bias source 26 is an RF bias source, for example at 13.56 MHz, coupled to the pedestal electrode 24 through a isolation capacitor. Such bias source produces a negative DC self-bias $V_B$ on the pedestal electrode 24 on the order of tens of volts. A working gas such as argon is supplied from a gas source 28 through a mass flow controller 30 and thence through a gas inlet 32 into the chamber. A vacuum pump system 34 pumps the chamber through a pumping port 36.

The biased shield 12 has a conventional shape including an outwardly projecting flange 40, an outer portion 42 extending axially downwardly from near the target 16 to in back of the support surface of the pedestal 24 and covering and protecting the sidewalls of the chamber, a bottom portion 44 extending radially below the support surface of the pedestal 24 and protecting the bottom wall of the chamber, and an inner portion 46 extending axially upwardly to near the support surface of the pedestal 24 to protect its sides.

According to this embodiment of the invention, the flange of the biased shield 12 is supported on the chamber wall through a second electrical isolator 48 and is electrically biased by a voltage source 50 to a DC shield voltage $V_s$. In the preferred use of the invention, the shield voltage $V_s$ is positive and of the order of 10 to 50V.

A grounded shield 56 is positioned about the chamber wall near the target 16 and is electrically grounded to the wall. It extends axially downwardly to provide some overlap with the biased shield 12.

A small-area magnetron 60 is positioned at the back of the target 16 and includes a stronger outer magnet pole 62 of one polarity and a weaker inner magnet pole 64 of the other polarity supported and magnetically coupled by a magnetic yoke 66. An unillustrated motor rotates a shaft 68 fixed to the yoke support 66 so that the magnetron 60 rotates about the center axis 70 of the chamber to provide more uniform sputtering of the target 16.

When sufficient target voltage $V_T$ is applied to the target 16, a plasma is excited from the argon working between the target 16 and the grounded shield 56. Typical target voltages need to sustain the plasma are −400 to −600VDC. The magnetron 60 generates a strong magnetic field extending horizontally in front of the target 16 between the two poles 62, 64. The magnetic field traps electrons and thus produces a region 72 of a high-density plasma adjacent the target 16 at the location of the magnetron. The high-density plasma increases the sputtering rate. The stronger outer magnet 62 additionally projects some magnetic field lines axially towards the wafer 22 before those field lines return to the yoke 66 at the back of the stronger magnet 62. The vertical magnetic component prevents excessive electron loss to the grounded upper shield 56 and extends the denser plasma closer to the wafer 22.

Self-ionized plasma (SIP) sputtering produces a high fraction of ionization in the sputtered atoms. Two benefits are that the ionized sputtered particles can be electrostatically directed to deep within high-aspect ratio holes and that the argon pressure can be reduced after ignition of the plasma. For copper and a few other metals, a SIP reactor can generate a sustained self-sputtering (SSS) plasma in which a large fraction of the copper ions are attracted back to the copper target and resputter it with sufficient yield of further copper ions that the argon working gas can be turned off once the plasma is ignited.

Figure 2:
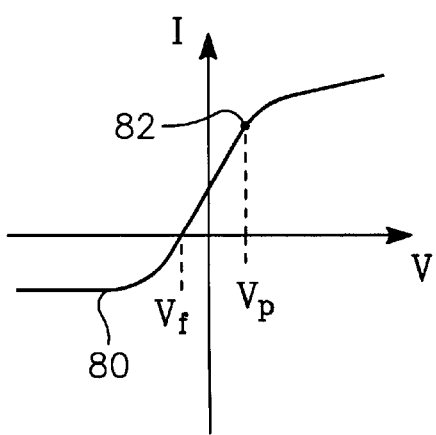
FIG. 2 is a graph illustrating the diode characteristics of a DC sputter reactor.

The bias voltage $V_s$ impressed on the biased shield 12 is sufficient to repel ions from the shield 12 even in the area where there is no vertical magnetic field. A DC plasma sputtering reactor can be electrically characterized as a diode having a non-linear relationship between current and voltage such as the I–V curve 80 shown in FIG. 2. Even at zero current, the voltage across the plasma is a negative floating potential $V_f$. With increasing voltage, the current rises until it begins to saturate above a knee 82 which is associated with the plasma potential $V_p$. Assuming one of the electrodes is grounded, the plasma potential $V_p$ is the substantially constant positive potential within the plasma between the two plasma sheaths. Methods are known to experimentally measure the plasma potential, for example, by use of Langmuir probes. When an auxiliary electrode such as the biased shield 12 is positioned near to a plasma that is otherwise excited and maintained, the auxiliary electrode repels positive ions even though it attracts electrons and depletes them from the plasma.

For the types of plasmas and power levels used in commercial sputter depositions, the plasma potential $V_p$ typically has a value in the range of 10 to 20V. It is recommended that the shield voltage $V_s$ be substantially greater than the plasma potential $V_p$ but not be so great as to become the primary anode. A recommended range for shield voltages is 15 to 50V.

However, the presence of the large positively biased shield affects the plasma, particularly close to the pedestal. As a result, the DC self-bias developed on the pedestal, particularly by an RF bias source, may be more positive than for the conventional large grounded shield, that is, less negative since the DC self-bias is negative in typical applications. It is believed that the change in DC self-bias arises from the fact that the positively biased shield drains electrons from the plasma, thereby causing the plasma and hence the pedestal electrode to become more positive.

Experiments were performed in which the biased lower shield and grounded upper shield were used in sputtering a copper seed layer into a 0.18 $\mu$m-wide via in a 1.2 $\mu$m-thick oxide layer. That is, the via hole had an aspect ratio of 6.6. For such high aspect ratios, sidewall coverage of the via hole is the most demanding requirement because bottom coverage tends to be greater.

The sputter reactor was operated with 15 kW of target power and 200 W of pedestal bias power. When +30VDC was applied to the biased shield during sputter deposition of copper to a blanket thickness of 194 nm, the sidewall coverage was 9 nm (5%), and the bottom coverage was 14 nm (7%). At this blanket thickness, overhangs were beginning to bridge the top of the via hole, but not to the point of blocking access to the hole, for example, for electrochemical plating of copper into the hole. The 9 mn sidewall coverage is more than sufficient for a seed and electrode layer for such plating. For comparison, when the biased shield was grounded, the sidewall coverage was only 2.6%, and the bottom coverage was 5%.

Figure 3:
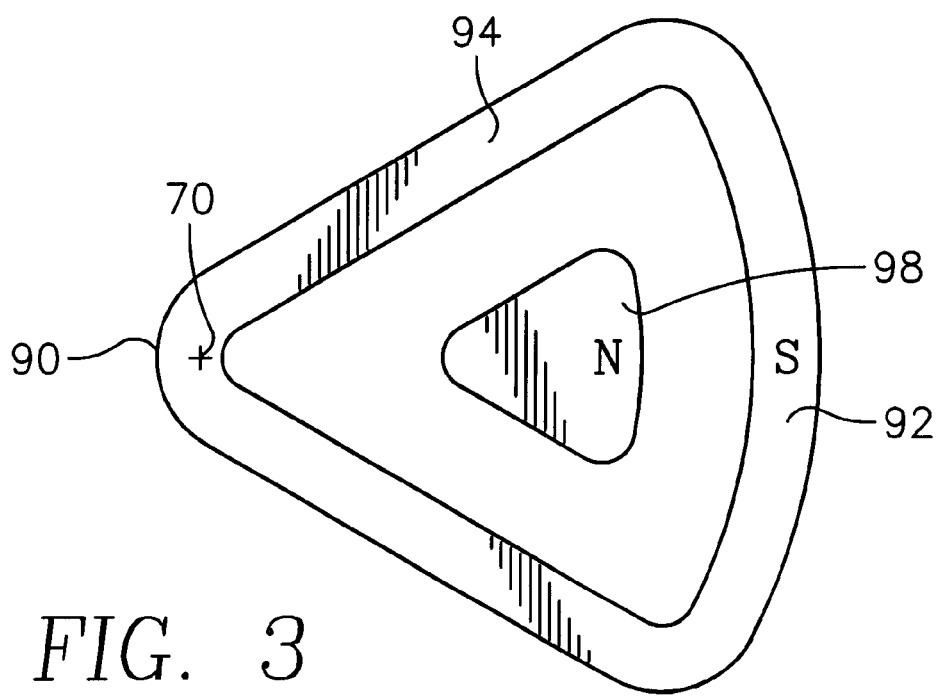
FIG. 3 is a plan view of a triangularly shaped magnetron usable with the invention.
Figure 4:
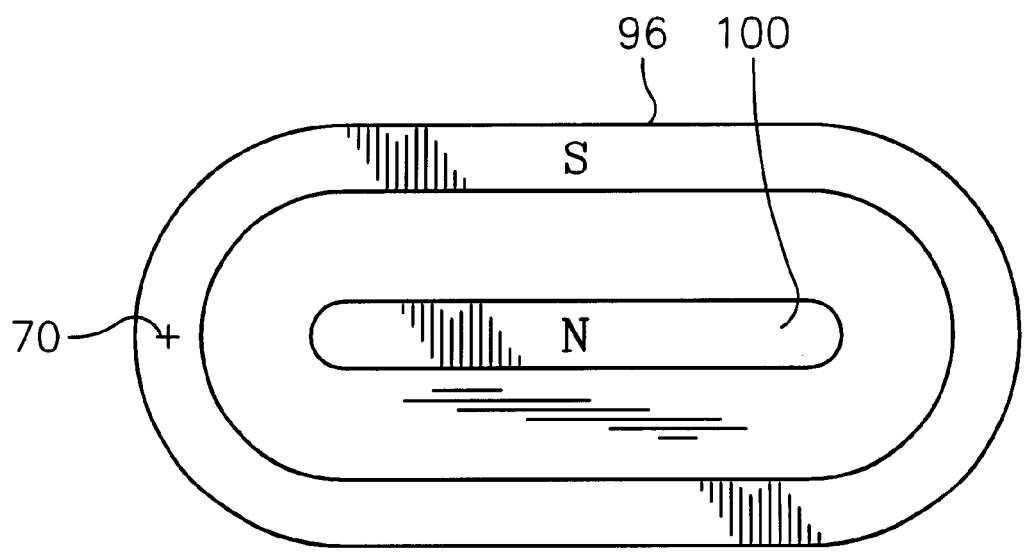
FIG. 4 is a plan view of a magnetron shaped like an elongated oval.

The magnetron 60 illustrated in FIG. 1 is illustrative only. Unbalanced magnetrons for SIP sputtering are typically shaped as a triangle or as a racetrack although circular and oval magnetrons are being developed. The triangular shape illustrated in the plan view of FIG. 3 includes a narrow comer 90 near the target center 70 and an arced side 92 near the target periphery. The racetrack shape (or more generally as an elongated oval) as illustrated in the plan view of FIG. 4 extends from the center 70 to the periphery of the target. In both cases, an outer pole 94 or 96 surrounds and encloses an inner pole 98 or 100 of opposite magnetic polarity, and the total magnetic flux in the outer pole is substantially higher than that in the inner pole. Both these shapes have relatively small areas of less than 20% of the target area. The small magnetron area increases the effective power density at the target which is determined by the ratio of target power to the area of the magnetron. Target powers are typically between 20 and 40 kW for a 200 mm wafer so that the target power density can be greater than about 300 W/cm$^2$. To achieve high ionization fractions with the biased shield of the invention, a small-area magnetron having poles that close on themselves are preferred because of their high-power density and the lack of plasma leakage from the ends of the magnetron. However, the biased shield reduces the need for a strong asymmetry in pole strength because the biased shield can perform the function of guiding the plasma and ions toward the wafer. As a result, the biased shield is particularly useful for the vaulted target of Fu et al. since it is difficult to design a strongly unbalanced magnetron within the constrained geometry of the annular vault. However, some asymmetry with a stronger pole located near the target periphery is desired to guide the plasma past the upper grounded shield.

The biased shield allows the throw of the sputter reactor, that is, the spacing between the target and wafer, to be increased without a substantial reduction in the sputter ion flux. A spacing of greater than 125% of the wafer diameter may be considered long throw. The increased throw filters out some of the neutral sputter atoms which do not coat well into narrow holes. Furthermore, for shorter throws the center of the wafer is subject to a larger particle flux than is the edge of the wafer. A longer throw increases the center-to-edge uniformity because there is less variation in the flux.

The biased shield of the invention provides an additional degree of control in magnetron sputtering with only a slight increase in the complexity of the chamber.

What is claimed is:

1. A DC sputter reactor, comprising:

a vacuum chamber having sidewalls extending along a center axis;

a target sealed to said sidewalls;

a support electrode in said chamber for holding on a support surface located at its front a substrate to be sputter deposited in opposition along said axis to said target;

a magnetron disposed on a back side of said target relative to said support and rotatable about a center of said target;

a first shield arranged around first portions of said sidewalls adjacent to said target and configured to protect said first portions from sputter deposition and held at a predetermined first potential;

a first DC power supply selectively connected to said target and capable of biasing said target negatively with respect to said predetermined first potential to create a plasma in said chamber;

an RF power supply connected to said support electrode to create a negative DC self-bias on said support surface relative to said predetermined first potential;

a second shield having side portions arranged around second portions of said sidewalls disposed further away from said target than said first portions both in front of and in back of a plane of said support surface and configured to protect said second portions from sputter deposition and having bottom portions extending from said support electrode toward said second portions of said sidewalls in back of said support surface; and a second DC power supply selectively connected to said second shield and capable of biasing said second shield to a shield voltage more positive than said predetermined first potential.

2. The reactor of claim 1, wherein said predetermined first potential is a ground potential and said chamber is electrically grounded.

3. The reactor of claim 1, wherein said magnetron comprises an outer pole of a first magnetic polarity and a first total magnetic flux and an inner pole surrounded by said outer pole of a second magnetic polarity opposite said first magnetic polarity and a second total magnetic flux less than said first total magnetic flux.

4. A DC sputter reactor, comprising:

a vacuum chamber having sidewalls extending along a center axis;

a target sealed to and electrically isolated from said sidewalls;

a pedestal electrode disposed in and electrically isolated from said chamber for holding on a support surface a substrate to be sputter deposited, said support surface extending in opposition along said axis to said target;

a first shield grounded to said vacuum chamber and protecting first portions of said sidewalls;

a second shield electrically isolated from said vacuum chamber and disposed closer to said pedestal electrode on a side thereof facing said target than said first shield and protecting second portions of said sidewalls closer to said pedestal electrode than said first portions, wherein said second shield includes an outer cylindrical portion protecting said second portions of said sidewalls and a bottom portion connected to said outer cylindrical portion and extending radially of said axis on a side of said support surface opposite said target and protecting a bottom wall of said vacuum chamber;

a first DC power supply capable of impressing a negative DC voltage on said target; and a second DC power supply capable of impressing a positive DC voltage on said second shield.

5. The reactor of claim 4, further comprising a third power supply capable of causing a negative potential to develop on said pedestal electrode.

6. The reactor of claim 4, wherein said second shield additionally includes an inner cylindrical portion connected to said bottom portion and extending axially along sides of said pedestal toward said support surface.

7. The reactor of claim 4, wherein said second power supply is capable of applying said positive DC voltage included in a range between 10 and 50VDC.

8. The reactor of claim 4, further including an RF power supply coupled to said pedestal electrode.

9. The reactor of claim 4, further comprising a magnetron disposed on a back side of said target relative to said pedestal electrode and rotatable about a center of said target.

10. The reactor of claim 9, wherein said magnetron comprises an outer pole of a first magnetic polarity and a first total magnetic flux and an inner pole surrounded by said outer pole of a second magnetic polarity opposite said first magnetic polarity and a second total magnetic flux less than said first total magnetic flux.

11. A method of operating a sputter reactor, comprising the steps of:

applying sufficient negative DC voltage to a metal target to maintain a plasma in a vacuum chamber which sputters metal atoms from said target, at least 5% of said metal atoms being ionized into metal ions;

applying a positive DC voltage to a shield surrounding a processing space between said target and a pedestal electrode supporting a substrate to be sputter coated; and inducing a negative DC bias relative to said positive DC voltage on said pedestal electrode.

12. The method of claim 11, wherein said positive DC voltage is greater than a plasma potential of said plasma.

13. The method of claim 11, wherein said positive DC voltage is in a range of 10 to 50VDC.

14. The method of claim 13, wherein said range extends between 15 and 40VDC.

15. The method of claim 11, wherein said inducing step couples RF power to said pedestal electrode through an isolation capacitor.

* * * * *